(12) United States Patent
Watanabe

(10) Patent No.: US 6,509,861 B2
(45) Date of Patent: Jan. 21, 2003

(54) METHOD AND APPARATUS FOR PROVIDING A MOVING FILTER

(75) Inventor: Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/939,823

(22) Filed: Aug. 28, 2001

(65) Prior Publication Data

US 2002/0093445 A1 Jul. 18, 2002

(30) Foreign Application Priority Data

Jan. 16, 2001 (JP) ........................................ 2001-007651

(51) Int. Cl.[7] ................................................ H03M 1/60
(52) U.S. Cl. ........................................ 341/157; 341/155
(58) Field of Search ................................ 341/157, 166, 341/155, 118; 377/42, 124

(56) References Cited

U.S. PATENT DOCUMENTS

| | | | | |
|---|---|---|---|---|
| 4,020,362 A | * | 4/1977 | Suzuki et al. ................. | 307/225 |
| 5,128,624 A | | 7/1992 | Hoshino et al. ............... | 377/43 |
| 5,138,320 A | * | 8/1992 | Ngo et al. ..................... | 341/173 |
| 5,289,135 A | | 2/1994 | Hoshino et al. ............... | 377/43 |
| 5,396,247 A | | 3/1995 | Watanabe et al. ............. | 341/157 |
| 5,525,899 A | | 6/1996 | Watanabe et al. ............. | 341/157 |
| 5,568,071 A | | 10/1996 | Hoshino et al. ............... | 377/43 |
| 6,073,259 A | * | 6/2000 | Sartschev et al. ............. | 714/724 |

FOREIGN PATENT DOCUMENTS

| | | | | |
|---|---|---|---|---|
| JP | A-5-259907 | 10/1993 | ............ | H03M/1/60 |
| JP | A-7-154256 | 6/1995 | ............ | H03M/1/60 |
| JP | B2-2868266 | 12/1998 | ............ | H03K/5/26 |
| JP | A-11-177427 | 7/1999 | ............ | G01R/25/08 |

* cited by examiner

*Primary Examiner*—Peguy JeanPierre
(74) *Attorney, Agent, or Firm*—Law Offices of David G. Posz

(57) ABSTRACT

An analog input signal is inputted into a pulse delay circuit including a series combination of delay units. The analog input signal controls signal delay times provided by the respective delay units. A pulse signal is inputted into the pulse delay circuit. The pulse signal is transmitted in the pulse delay circuit while being sequentially delayed by the delay units. Detection is made as to a number of ones among the delay units through which the pulse signal has passed during a setting time from a moment at which the pulse signal is inputted into the pulse delay circuit. Information representative of a level of the analog input signal is generated in response to the detected number.

15 Claims, 7 Drawing Sheets

METHOD AND APPARATUS FOR PROVIDING A MOVING FILTER

BACKGROUND OF THE INVENTION

1. Field of the Invention

This invention relates to a method of detecting a signal level which has a filtering function. Also, this invention relates to an apparatus for detecting a signal level which has a filtering function.

2. Description of the Related Art

A conventional control system includes a sensor for detecting a condition of a controlled object and outputting an analog signal representative thereof, and a controller for processing the sensor output signal. It is known to provide a low pass filter between the sensor and the controller. The low pass filter removes high-frequency noise from the sensor output signal, and feeds the resultant noise-free signal to the controller. The low pass filter is of the analog type or the digital type.

The analog-type low pass filter has a cutoff frequency determined by the parameters of a resistor and a capacitor. The parameters of the resistor and the capacitor depend on temperature. Therefore, the cutoff frequency of the analog-type low pass filter depends on temperature.

The digital-type low pass filter uses many transistors, and is large in circuit scale and high in cost. The digital-type low pass filter includes an anti-aliasing pre-filter and an A/D (analog-to-digital) converter located before the digital filtering stage. The pre-filter uses an analog-type low pass filter. As previously mentioned, the cutoff frequency of the analog-type low pass filter depends on temperature.

U.S. Pat. No. 5,396,247 discloses a pulse circulating circuit which includes inverting circuits each for inverting an input signal and outputting an inversion of the input signal. A time of signal inversion by each of the inverting circuits varies in accordance with a power supply voltage applied thereto. One of the inverting circuits constitutes a trigger inverting circuit for starting which is controllable in inversion operation. The pulse circulating circuit circulates a pulse signal therethrough after the trigger inverting circuit starts to operate. An input terminal subjected to an analog voltage signal is connected to power supply lines of the respective inverting circuits for applying the analog voltage signal to the inverting circuits as a power supply voltage fed thereto. A counter serves to count a number of times of complete circulation of the pulse signal through the pulse circulating circuit. A circulation position detecting device serves to detect a circulation position of the pulse signal in the pulse circulating circuit on the basis of output signals of the respective inverting circuits. A control device is operative for activating the trigger inverting circuit and thereby starting pulse circulating operation of the pulse circulating circuit, and for activating the circulation position detecting device at a moment which follows a moment of starting pulse circulating operation by a given time. An output device is operative for outputting digital data as a result of A/D conversion of the analog voltage signal. The A/D conversion result data has lower bits composed of output digital data of the circulation position detecting device, and higher bits composed of output digital data of the counter.

SUMMARY OF THE INVENTION

It is a first object of this invention to provide a method of detecting a signal level which has a stable filtering function for removing high-frequency noise.

It is a second object of this invention to provide an apparatus for detecting a signal level which has a stable filtering function for removing high-frequency noise.

A first aspect of this invention provides a method of detecting a signal level which has a filtering function. The method comprises the steps of inputting an analog input signal into a pulse delay circuit including a series combination of delay units, the analog input signal controlling signal delay times provided by the respective delay units; inputting a pulse signal into the pulse delay circuit, the pulse signal being transmitted in the pulse delay circuit while being sequentially delayed by the delay units; detecting a number of ones among the delay units through which the pulse signal has passed during a setting time from a moment at which the pulse signal is inputted into the pulse delay circuit; and generating information representative of a level of the analog input signal in response to the detected number.

A second aspect of this invention is based on the first aspect thereof, and provides a method wherein the analog input signal is inputted as a drive voltage for the delay units to control the signal delay times provided by the respective delay units.

A third aspect of this invention is based on the first aspect thereof, and provides a method wherein the signal delay times provided by the delay units depend on drive currents fed thereto respectively, and the analog input signal controls the drive currents fed to the delay units to control the signal delay times provided by the respective delay units.

A fourth aspect of this invention is based on the first aspect thereof, and provides a method further comprising the step of changing the setting time to adjust a low pass filtering characteristic for removing high-frequency noise components.

A fifth aspect of this invention is based on the first aspect thereof, and provides a method wherein the delay units are connected in a ring to form a ring delay line through which the pulse signal circulates, and a position of the pulse signal in the ring delay line is detected and a number of times of complete circulation of the pulse signal through the ring delay line is detected, and the information representative of the level of the analog input signal is generated in response to the detected position and the detected number of times.

A sixth aspect of this invention provides a signal-level detecting apparatus having a filtering function. The apparatus comprises a pulse delay circuit including a series combination of delay units having signal delay times depending on an analog input signal; means for inputting a pulse signal into the pulse delay circuit, the pulse signal being transmitted in the pulse delay circuit while being sequentially delayed by the delay units; means responsive to a clock signal for detecting a position in the pulse delay circuit which the pulse signal reaches at a timing determined by the clock signal; and means for generating information representative of a level of the analog input signal in response to the position detected by the detecting means.

A seventh aspect of this invention is based on the sixth aspect thereof, and provides an apparatus wherein the delay units receive the analog input signal as a drive voltage so that the signal delay times of the delay units depend on the analog input signal.

An eighth aspect of this invention is based on the sixth aspect thereof, and provides an apparatus wherein the pulse delay circuit comprises means for controlling drive currents fed to the delay units in response to the analog input signal to control the signal delay times of the delay units in response to the analog input signal.

A ninth aspect of this invention is based on the sixth aspect thereof, and provides an apparatus wherein the detecting means comprises an encoder for converting output signals of the delay units into a signal representing the position in the pulse delay circuit which the pulse signal reaches.

A tenth aspect of this invention is based on the sixth aspect thereof, and provides an apparatus wherein the delay units are connected in a ring to form a ring delay line through which the pulse signal circulates, and the detecting means comprises means for detecting a number of times of complete circulation of the pulse signal through the ring delay line, and the generating means comprises means for generating the information representative of the level of the analog input signal in response to the detected position and the detected number of times.

DETAILED DESCRIPTION OF THE INVENTION

Prior-art low pass filters will be explained below for a better understanding of this invention.

Figure 1:
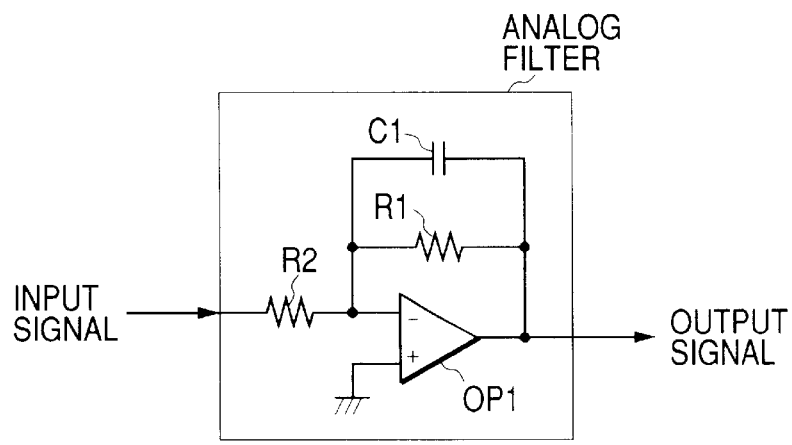
FIG. 1 is a diagram of a first prior-art low pass filter which is of the analog type.

FIG. 1 shows a first prior-art low pass filter which is of the analog type. The prior-art filter in FIG. 1 includes an operational amplifier OP1, resistors R1 and R2, and a capacitor C1. The noninverting input terminal of the operational amplifier OP1 is grounded. The capacitor C1 and the resistor R1 are combined in parallel. The parallel combination of the capacitor C1 and the resistor R1 is connected between the inverting input terminal of the operational amplifier OP1 and the output terminal thereof. On end of the resistor R2 is connected to the inverting input terminal of the operational amplifier OP1. The other end of the resistor R2 constitutes the input terminal of the filter. The output terminal of the operational amplifier OP1 constitutes the output terminal of the filter. An analog input signal is applied via the resistor R2 to the inverting input terminal of the operational amplifier OP1. The prior-art filter in FIG. 1 processes the analog input signal into an analog output signal which appears at the output terminal of the operational amplifier OP1.

During operation of the prior-art filter in FIG. 1, the capacitor C1 is charged and discharged via the resistors R1 and R2 in response to the analog input signal so that the low pass filtering is implemented on the analog input signal.

Figure 2:
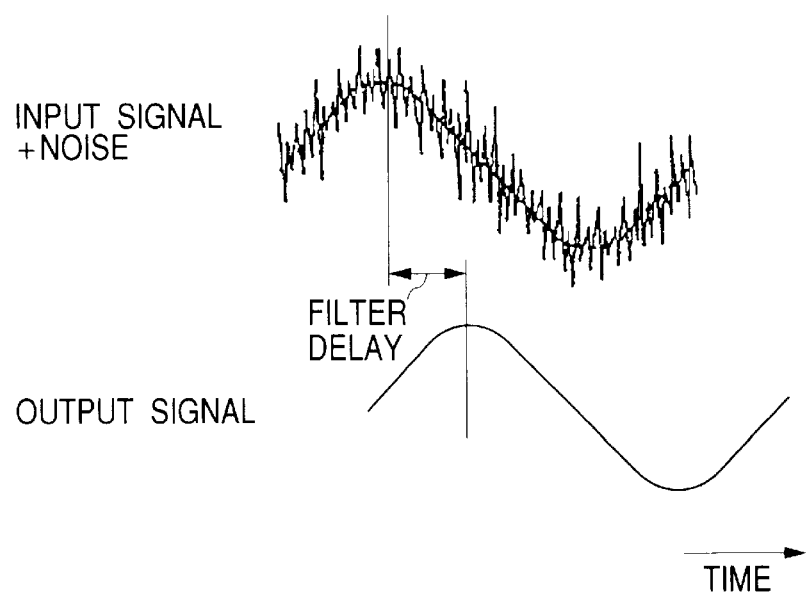
FIG. 2 is a time-domain diagram of an example of the waveforms of signals inputted into and outputted from the prior-art filter in FIG. 1.

FIG. 2 shows an example of the waveforms of the analog input signal and the analog output signal regarding the prior-art filter in FIG. 1. As shown in FIG. 2, high-frequency noise is removed by the prior-art filter of FIG. 1. The analog output signal delays from the analog input signal by a time interval (a signal delay time or a filter delay time) determined by the resistances of the resistors R1 and R2 and the capacitance of the capacitor C1. The cutoff frequency of the prior-art filter in FIG. 1 is also determined by the parameters of the resistors R1 and R2 and the capacitor C1.

The parameters of the capacitor C1 and the resistors R1 and R2 depend on temperature. Therefore, the signal delay time provided by the prior-art filter in FIG. 1 and the cutoff frequency thereof depend on temperature.

Figure 3:
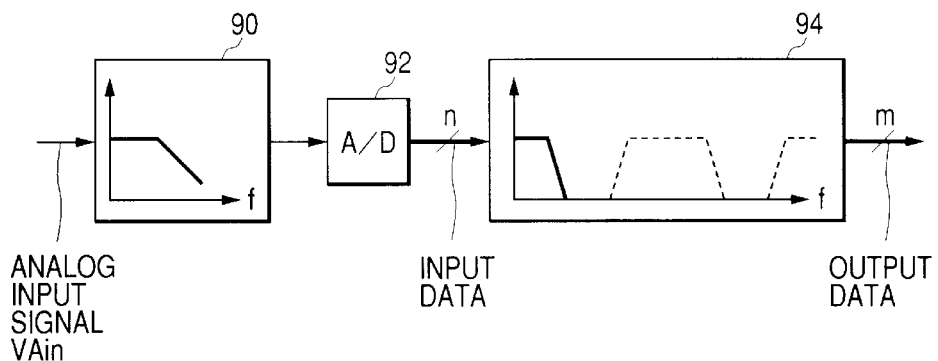
FIG. 3 is a block diagram of a second prior-art low pass filter which is of the digital type.

FIG. 3 shows a second prior-art low pass filter which is of the digital type. The prior-art filter in FIG. 3 includes an anti-aliasing pre-filter 90, an A/D (analog-to-digital) converter 92, and a digital filtering section 94 which are connected sequentially in that order.

The pre-filter 90 subjects an analog input signal VAin to a low pass filtering process for anti-aliasing. The pre-filter 90 outputs the resultant analog signal to the A/D converter 92. The A/D converter 92 changes the output signal of the pre-filter 90 into a corresponding n-bit parallel-form digital signal. The A/D converter 92 outputs the n-bit parallel-form digital signal to the digital filtering section 94. The digital filtering section 94 removes high-frequency noise components from the n-bit parallel-form digital signal to generate an m-bit parallel-form digital signal as a noise-free signal. The digital filtering section 94 outputs the m-bit parallel-form digital signal. The m-bit parallel-form digital signal is the output signal from the prior-art filter of FIG. 3.

Figure 4:
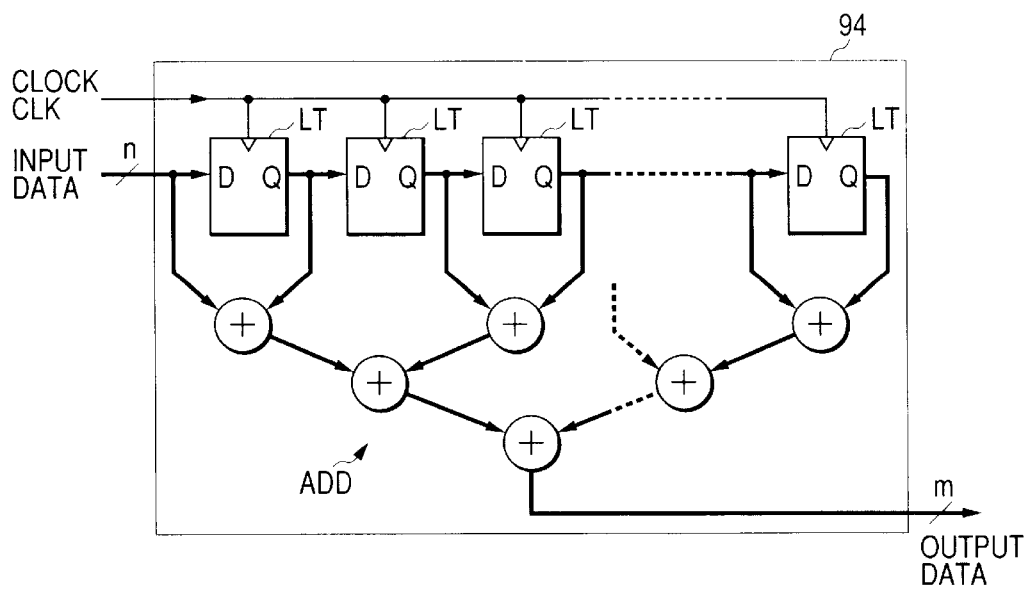
FIG. 4 is a block diagram of a digital filtering section in the prior-art filter in FIG. 3.

As shown in FIG. 4, the digital filtering section 94 includes an array of latch circuits LT connected in series or cascade, and an adder circuit ADD composed of adding elements. The latch circuits LT operate synchronously with a clock pulse signal CLK having a fixed period. The n-bit parallel-form digital signal outputted from the A/D converter 92 sequentially passes through the latch circuits LT while being successively latched and delayed thereby. The non-delayed n-bit parallel-form digital signal, and the delayed n-bit parallel-form digital signals outputted from the latch circuits LT are added by the circuit ADD into the m-bit parallel-form digital signal.

The latch circuits LT and the adder circuit ADD take a mean (an average) of movement of data in the n-bit parallel-form digital signal. The mean of movement forms the m-bit parallel-form digital signal representing the level of the analog input signal VAin from which high-frequency noise has been removed. The number (the stage number) of the latch circuits LT determines a width of the mean of movement. The signal delay time provided by the digital filtering section 94 is equal to half the signal delay time given by the latch-circuit array, that is, half the period of the clock pulse signal CLK which is multiplied by the number of the latch circuits LT.

In general, the clock pulse signal CLK is generated by a crystal oscillator. Therefore, the period of the clock pulse signal CLK hardly depends on temperature. Accordingly, the signal delay time provided by the digital filtering section 94 and the filtering characteristics thereof hardly depend on temperature.

The latch circuits LT and the adder circuit ADD use many transistors. Therefore, the prior-art filter of FIG. 3 is large in circuit scale and high in cost. The pre-filter 90 uses an analog-type low pass filter. Accordingly, the signal delay time provided by the pre-filter 90 and the cutoff frequency thereof depend on temperature.

First Embodiment

Figure 5:
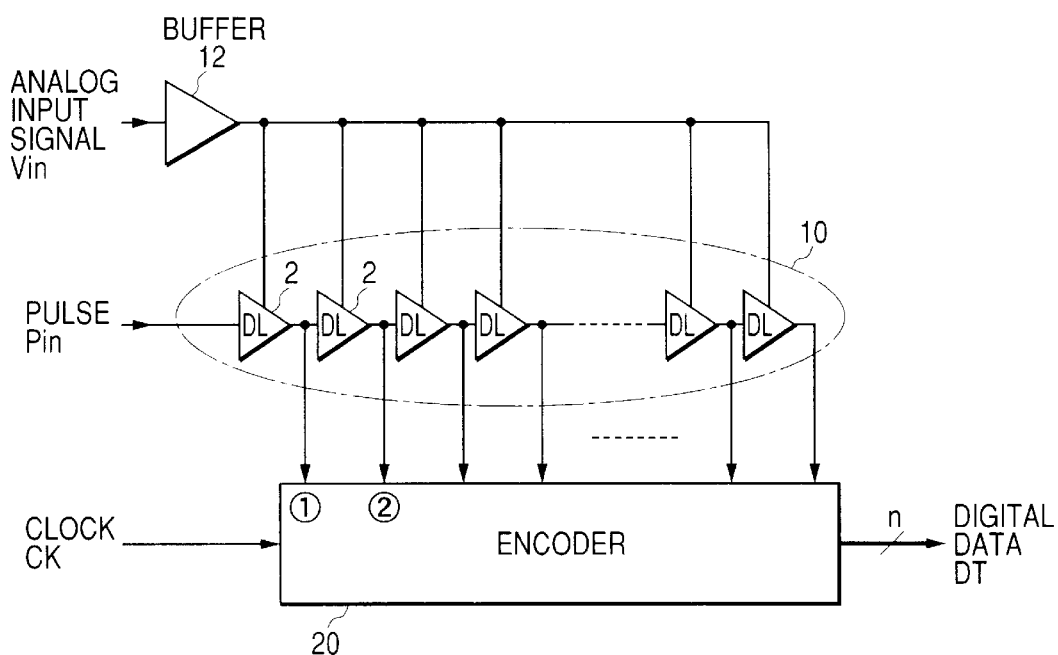
FIG. 5 is a block diagram of a signal-level detecting apparatus according to a first embodiment of this invention.

FIG. 5 shows a signal-level detecting apparatus according to a first embodiment of this invention. The apparatus of FIG. 5 includes a pulse delay circuit 10, a buffer 12, and an encoder 20.

The pulse delay circuit 10 has a plurality of delay units (delay elements) 2 connected in series or cascade. Each of the delay units 2 delays a signal inputted thereinto, and outputs the resultant delayed signal. The locations of the delay units 2 correspond to respective stages in the pulse delay circuit 10. A pulse signal Pin is fed to the input terminal of the first-stage delay unit 2. The pulse signal Pin sequentially passes through the delay units 2 while being successively delayed thereby. The pulse signal Pin contains a train of high-level pulses or a train of low-level pulses. Every pulse of the signal Pin is applied to the input terminal of the first-stage delay unit 2 in synchronism with a clock pulse signal CK. Every pulse of the signal Pin sequentially propagates through the delay units 2 while being successively delayed thereby. The output signal from each delay unit 2 represents whether or not a pulse has just reached the output terminal thereof.

Each of the delay units 2 includes a gate circuit. The delay units 2 have respective power supply terminals connected in common to the output terminal of the buffer 12. An analog input signal (a voltage input signal) Vin is applied to the input terminal of the buffer 12. The analog input signal Vin travels through the buffer 12 before being applied to the delay units 2 as a drive voltage (a power supply voltage) therefor. It should be noted that the buffer 12 may be replaced by an amplifier.

The clock pulse signal CK is applied to a control terminal of the encoder 20. The clock pulse signal CK is generated by a suitable device (not shown) such as a crystal oscillator or a temperature-compensated crystal oscillator. The clock pulse signal CK has a fixed period and a fixed frequency. At every suitable timing determined by the clock pulse signal CK, a pulse of the signal Pin is applied to the input terminal of the first-stage delay unit 2. The encoder 20 has data input terminals connected to the output terminals of the delay units 2 respectively. The device 20 encodes the output signals from the delay units 2 into n-bit parallel-form digital data DT, where "n" denotes a predetermined natural number equal to or greater than 2. The encoder 20 outputs the n-bit parallel-form digital data DT. Specifically, at the moment of the occurrence of every rising edge or every falling edge in the clock pulse signal CK, the encoder 20 samples the output signals of the delay units 2 and determines the logic states of the resultant signal samples. In addition, the encoder 20 detects which of the output terminals of the delay units 2 a pulse of the signal Pin reaches by referring to the determined logic states of the signal samples. In other words, at the moment of the occurrence of every rising edge or every falling edge in the clock pulse signal CK, the encoder 20 detects how many delay units 2 a pulse of the signal Pin has passed through. The encoder 20 converts the result of the detection into the n-bit parallel-form digital data DT.

The period of the clock pulse signal CK is set to a value sufficiently longer than the signal delay time provided by each of the delay units 2. For example, the period of the clock pulse signal CK is equal to or longer than several tens times the signal delay time provided by each of the delay units 2. The total number of the delay units 2 in the pulse delay circuit 10 is chosen so that when one period of the clock pulse signal CK has elapsed since the moment of the application of a pulse in the signal Pin to the first-stage delay unit 2, the pulse will remain in the pulse delay circuit 10. For example, the total number of the delay units 2 in the pulse delay circuit 10 is in the range from several tens to several hundreds. The total number of the delay units 2 in the pulse delay circuit 10 may be more than several hundreds.

Figure 6:
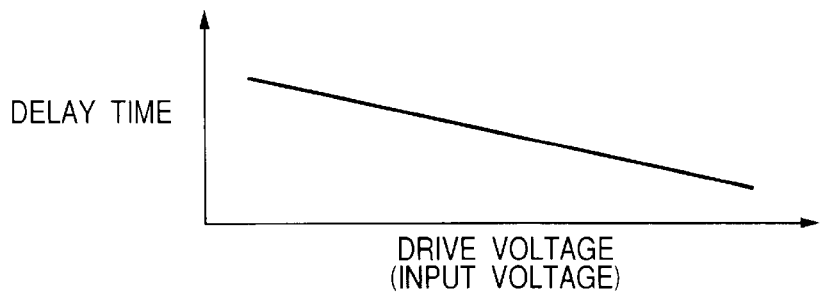
FIG. 6 is a diagram of the relation between a signal delay time provided by each delay unit and a drive voltage fed thereto.

As previously mentioned, the analog input signal Vin is fed via the buffer 12 to the delay units 2 as a drive voltage (a power supply voltage) therefor. With reference to FIG. 6, the signal delay time provided by each of the delay units 2 decreases as the drive voltage fed thereto rises. Thus, the signal delay time provided by each of the delay units 2 decreases as the voltage of the analog input signal Vin rises.

As previously mentioned, the output signal from each of the delay units 2 represents whether or not a pulse has just reached the output terminal thereof. A pulse of the signal Pin is applied to the first-stage delay unit 2 at the start of every period of the clock pulse signal CK. At the end of every period of the clock pulse signal CK, the encoder 20 detects which of the output terminals of the delay units 2 the pulse in the signal Pin reaches by referring to the output signals from the delay units 2, or detects how many delay units 2 the pulse in the signal Pin has passed through by referring to the output signals from the delay units 2. The encoder 20 converts the result of the detection into the n-bit parallel-form digital data DT. Since the signal delay time provided by each of the delay units 2 decreases as the voltage of the analog input signal Vin rises, the number of delay units 2 through which the pulse in the signal Pin has passed increases as the voltage of the analog input signal Vin rises. Therefore, the n-bit parallel-form digital data DT represent the voltage (the voltage level) of the analog input signal Vin.

In the case where the analog input signal Vin has superimposed high-frequency noise components, the signal delay time provided by each of the delay units 2 fluctuates in accordance with the high-frequency noise components.

Figure 7:
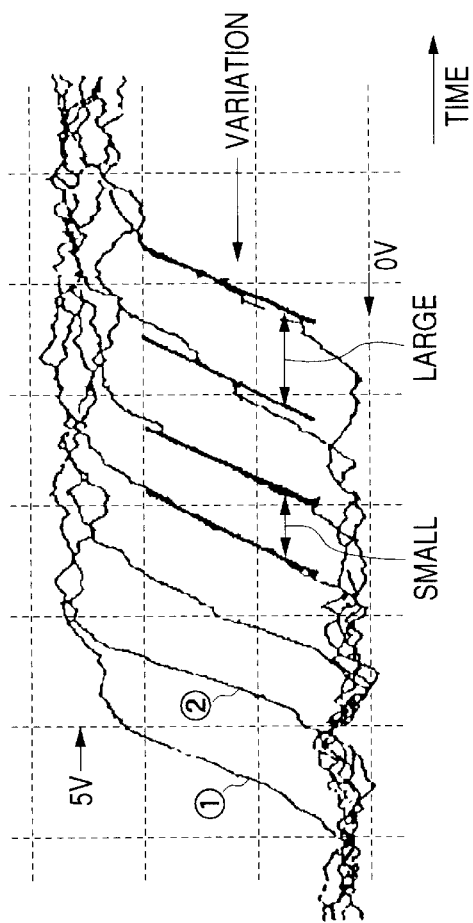
FIG. 7 is a time-domain diagram of an example of the waveforms of output signals from seven successive ones among delay units in FIG. 5.

FIG. 7 shows an example of the waveforms of the output signals from seven successive ones among the delay units 2 which occur in the case where a pulse of the signal Pin passes therethrough and the analog input signal Vin has superimposed high-frequency noise components. In FIG. 7, low-to-high voltage changes in the output signals from the delay units 2 correspond to the propagation of the pulse therethrough. As previously mentioned, the signal delay time provided by each of the delay units 2 fluctuates in accordance with the high-frequency noise components. Thus, as shown in FIG. 7, low-to-high voltage changes in the output signals from the delay units 2 are spaced at time intervals which vary in accordance with the high-frequency noise components.

When the drive voltage (the analog input voltage Vin) fed to the delay units 2 is higher than a normal due to a positive side of superimposed high-frequency noise components, the signal delay time provided by each of the delay units 2 decreases. Thus, in this case, the pulse of the signal Pin takes a shorter time to pass through a delay unit 2. On the other hand, when the drive voltage (the analog input voltage Vin) fed to the delay units 2 is lower than the normal due to a negative side of superimposed high-frequency noise components, the signal delay time provided by each of the delay units 2 increases. Thus, in this case, the pulse of the signal Pin takes a longer time to pass through a delay unit 2.

Since the frequency of the noise components is relatively high, noise-caused shorter delay times and noise-caused longer delay times provided by delay units 2, through which a pulse of the signal Pin has passed, cancel out during every period of the clock pulse signal CK. In other words, noise-caused shorter delay times and noise-caused longer delay times provided by the delay units 2 are averaged to normal delay times determined by the true voltage of the analog input signal Vin. Accordingly, the number of delay units 2 through which the pulse in the signal Pin has passed during every period of the clock pulse signal CK is substantially independent of the high-frequency noise components. Thus, the n-bit parallel-form digital data DT generated by the encoder 20 accurately represent the true voltage of the analog input signal Vin.

Figure 8:
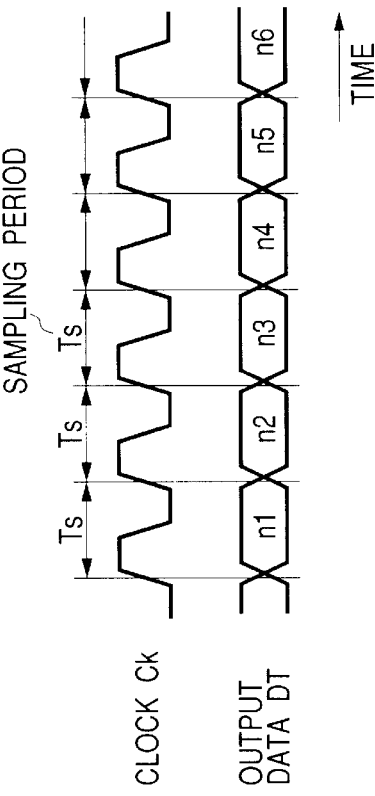
FIG. 8 is a time-domain diagram of a clock pulse signal CK and encoder output data DT in the apparatus of FIG. 5.

As shown in FIG. 8, the n-bit parallel-form digital data DT generated by the encoder 20 are updated for every period (every sampling period Ts) of the clock pulse signal CK. Specifically, at the start of every period Ts of the clock pulse signal CK, a pulse of the signal Pin is applied to the input terminal of the first-stage delay unit 2. At the end of every period Ts of the clock pulse signal CK, the encoder 20 detects the number of delay units 2 through which the pulse of the signal Pin has passed, and generates the n-bit parallel-form digital data DT in response to the detected number. The encoder 20 outputs the generated n-bit parallel-form digital data DT instead of the old data. Thus, the n-bit parallel-form digital data DT outputted from the encoder 20 are updated at the end of every period Ts of the clock pulse signal CK. The current n-bit parallel-form digital data DT outputted from the encoder 20 remain in a same state until the end of the present period Ts of the clock pulse signal OK.

As understood from the above description, the apparatus of FIG. 5 detects the level (the voltage level) of the analog input signal Vin while operating as a low pass filter for removing high-frequency noise components from the analog input signal Vin. In addition, the apparatus of FIG. 5 acts as an A/D (analog-to-digital) converter since the analog input signal Vin is converted into the n-bit parallel-form digital data DT.

When the apparatus of FIG. 5 is used in a control circuit to form a circuit for processing an analog sensor output signal, it is possible to decrease the scale of the control circuit and to reduce the cost thereof. The encoder 20 in the apparatus of FIG. 5 corresponds to a detecting means.

The noise removing performance or characteristic of the low pass filter provided by the apparatus of FIG. 5 is determined by the number of delay units 2 through which a pulse of the signal Pin passes during one period of the clock pulse signal CK in the case where the analog input signal Vin has a typical voltage. Specifically, the noise removing performance of the low pass filter is enhanced as the number of delay units 2 increases.

In general, high-frequency noise superimposed on the analog input signal Vin exhibits a normal distribution. Thus, to reduce a noise level to 1/10, the apparatus of FIG. 5 is designed so that a pulse of the signal Pin passes 100 delay units 2 during one period of the clock pulse signal CK. To further reduce the noise level, the apparatus of FIG. 5 is designed so that a pulse of the signal Pin passes more than 100 delay units 2 during one period of the clock pulse signal CK.

The number of delay units 2 through which a pulse of the signal Pin passes during one period of the clock pulse signal CK increases as the period (the sampling period Ts) of the clock pulse signal CK lengthens. Preferably, the period of the clock pulse signal CK is preset or preadjusted so as to provide a desired noise removing performance of the low pass filter.

Figure 9:
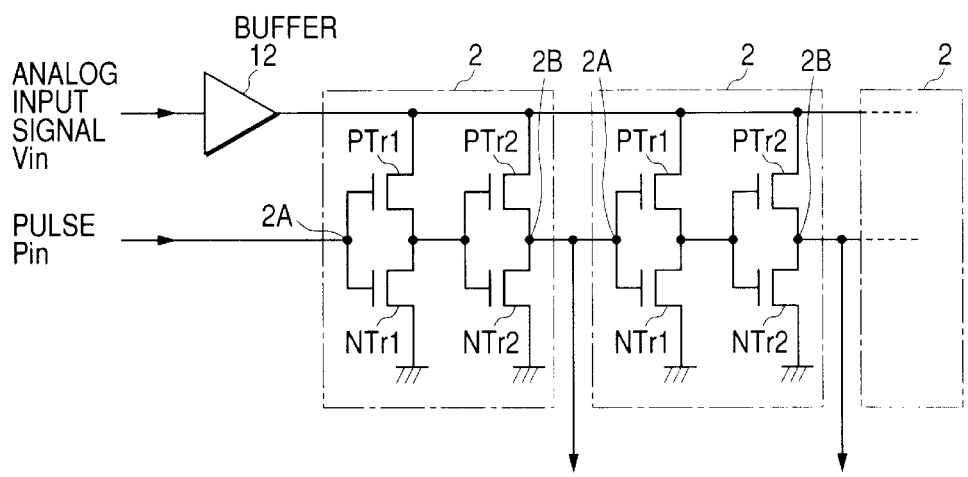
FIG. 9 is a schematic diagram of delay units in FIG. 5.

As shown in FIG. 9, each of the delay units 2 in the pulse delay circuit 10 has p-channel transistors (FET's) PTr1 and PTr2, and n-channel transistors (FET's) NTr1 and NTr2. The gates of the transistors PTr1 and NTr1 are connected in common to a delay-unit input terminal 2A. The source of the transistor PTr1 is connected to the output terminal of the buffer 12. The source of the transistor NTr1 is grounded. The drains of the transistors PTr1 and NTr1, and the gates of the transistors PTr2 and NTr2 are connected to each other. The source of the transistor PTr2 is connected to the output terminal of the buffer 12. The source of the transistor NTr2 is grounded. The drains of the transistors PTr2 and NTr2 are connected in common to a delay-unit output terminal 2B. The transistors PTr1 and NTr2 compose a first CMOS inverter. The transistors PTr2 and NTr2 compose a second CMOS inverter following the first MOS inverter. In the case of the first-stage delay unit 2, the delay-unit input terminal 2A is subjected to the pulse signal Pin, and the delay-unit output terminal 2B is connected to the input terminal of the second-stage delay unit 2 and the related input terminal of the encoder 20. In the case of each of the second-stage and later-stage delay units 2, the delay-unit input terminal 2A is connected to the output terminal of the preceding delay unit 2, and the delay-unit output terminal 2B is connected to the input terminal of the following-stage delay unit 2 and the related input terminal of the encoder 20. In the case of the last-stage delay unit 2, the delay-unit input terminal 2A is connected to the output terminal of the preceding delay unit 2, and the delay-unit output terminal 2B is connected to the related input terminal of the encoder 20.

In each of the delay units 2 of the pulse delay circuit 10, a pulse in the signal Pin successively propagates through the first and second CMOS inverters while being sequentially delayed thereby. The analog input signal Vin is fed via the buffer 12 to the first and second CMOS inverters in each of the delay units 2. The pulse delay times provided by the first and second CMOS inverters depend on the voltage (the level) of the analog input signal Vin.

The delay units 2 in the pulse delay circuit 10 can easily be made by CMOS integrated-circuit fabrication technologies. Therefore, the pulse delay circuit 10 can be low in cost.

Second Embodiment

Figure 10:
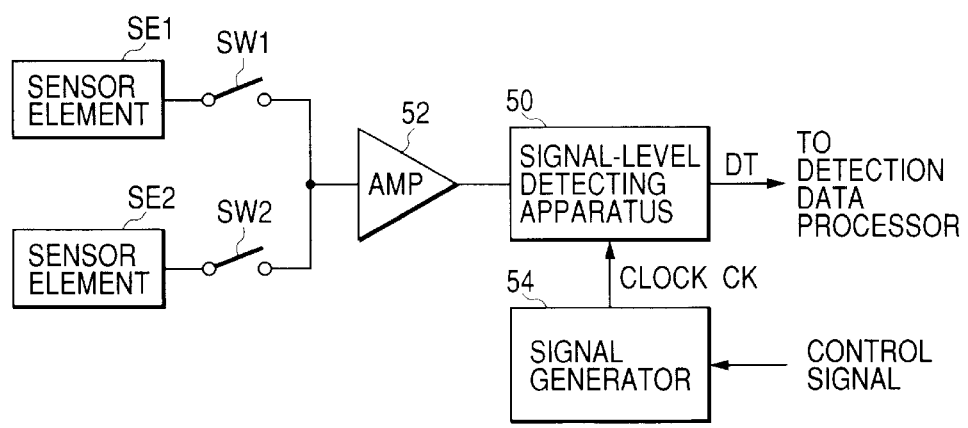
FIG. 10 is a block diagram of a control system according to a second embodiment of this invention.

FIG. 10 shows a control system according to a second embodiment of this invention. The control system in FIG. 10 includes a signal-level detecting apparatus 50 using the apparatus of FIG. 5. The control system in FIG. 10 further includes sensor elements SE1 and SE2, switches SW1 and SW2, an amplifier 52, and a signal generator 54. The output terminal of the sensor element SE1 is connected via the switch SW1 to the input terminal of the amplifier 52. The output terminal of the sensor element SE2 is connected via the switch SW2 to the input terminal of the amplifier 52. The output terminal of the amplifier 52 is connected to the input terminal of the apparatus 50. The output terminal of the apparatus 50 is connected to a later stage including a detection data processor (not shown). The output terminal of the signal generator 54 is connected to the apparatus 50.

It should be noted that the amplifier 52 may be used as the buffer 12 (see FIG. 5) in the apparatus 50. In this case, the buffer 12 (see FIG. 5) is omitted from the apparatus 50.

The sensor elements SE1 and SE2 output analog signals. The sensor element SE1 is of such a type that a high accuracy in the processing of the output signal thereof is desirable. On the other hand, the sensor element SE2 is of such a type that a high rate in the processing of the output signal thereof is desirable. The sensor element SE1 is, for example, a pressure sensor element, an acceleration sensor element, an angular-velocity sensor element, a stress sensor element, or a torque sensor element. The sensor element SE2 is, for example, a rotational-speed sensor element, a rotational-position sensor element, or a rotational-angle sensor element.

The signal generator 54 produces a clock pulse signal CK. The signal generator 54 outputs the clock pulse signal CK to the apparatus 50. The signal generator 54 changes between first and second states in response to a control signal fed thereto. When the signal generator 54 assumes its first state, the clock pulse signal CK is set to a first predetermined frequency and a first predetermined period (a predetermined low frequency and a predetermined long period). When the signal generator 54 assumes its second state, the clock pulse signal CK is set to a second predetermined frequency and a second predetermined period (a predetermined high frequency and a predetermined short period). The second predetermined frequency is higher than the first predetermined frequency. The second predetermined period is shorter than the first predetermined period.

In the case where the output signal of the sensor element SE1 is required to be inputted into the apparatus 50, the switch SW1 is changed to its on state (its closed state) while the switch SW2 is changed to its off state (its open state). Therefore, the output signal of the sensor element SE1 is transmitted via the switch SW1 to the amplifier 52, and is amplified thereby before being fed to the apparatus 50. At the same time, the signal generator 54 is changed to its first state by the control signal fed thereto so that the clock pulse signal CK supplied from the signal generator 54 to the apparatus 50 is set to the predetermined low frequency and the predetermined long period. Thus, in this case, the output signal of the sensor element SE1 is processed by the apparatus 50 in response to the low-frequency and long-period clock pulse signal CK In the case where the output signal of the sensor element SE2 is required to be inputted into the apparatus 50, the switch SW2 is changed to its on state (its closed state) while the switch SW1 is changed to its off state (its open state). Therefore, the output signal of the sensor element SE2 is transmitted via the switch SW2 to the amplifier 52, and is amplified thereby before being fed to the apparatus 50. At the same time, the signal generator 54 is changed to its second state by the control signal fed thereto so that the clock pulse signal CK supplied from the signal generator 54 to the apparatus 50 is set to the predetermined high frequency and the predetermined short period. Thus, in this case, the output signal of the sensor element SE2 is processed by the apparatus 50 in response to the high-frequency and short-period clock pulse signal CK.

Figure 11:
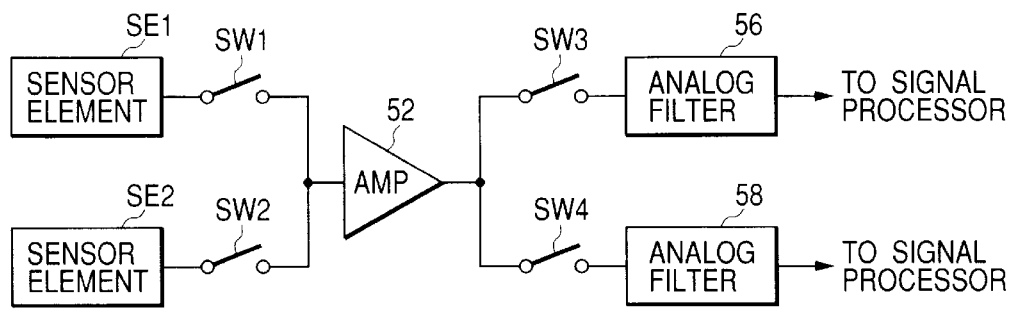
FIG. 11 is a block diagram of a control system which is a comparative system.

FIG. 11 shows a control system which is a comparative system.

The control system in FIG. 11 includes sensor elements SE1 and SE2, switches SW1, SW2, SW3, and SW4, an amplifier 52, and analog filters 56 and 58. The output terminal of the sensor element SE1 is connected via the switch SW1 to the input terminal of the amplifier 52. The output terminal of the sensor element SE2 is connected via the switch SW2 to the input terminal of the amplifier 52. The output terminal of the amplifier 52 is connected to the input terminals of the analog filters 56 and 58 via the switches SW3 and SW4 respectively. The output terminals of the analog filters 56 and 58 are connected to a later stage including a detection signal processor (not shown). The sensor elements SE1 and SE2, the switches SW1 and SW2, and the amplifier 52 are similar to those in FIG. 10. The analog filter 56 has characteristics suited for the output signal of the sensor element SE1. The analog filter 58 has characteristics suited for the output signal of the sensor element SE2.

The control system in FIG. 11 operates as follows. In the case where the output signal of the sensor element SE1 is required to be processed, the switches SW1 and SW3 are changed to their on states (their closed states) while the switches SW2 and SW4 are changed to their off states (their open states). Therefore, the output signal of the sensor element SE1 is transmitted via the switch SW1 to the amplifier 52, and is amplified thereby before being fed via the switch SW3 to the analog filter 56. Thus, in this case, the output signal of the sensor element SE1 is processed by the analog filter 56. On the other hand, in the case where the output signal of the sensor element SE2 is required to be processed, the switches SW2 and SW4 are changed to their on states (their closed states) while the switches SW1 and SW3 are changed to their off states (their open states). Therefore, the output signal of the sensor element SE2 is transmitted via the switch SW2 to the amplifier 52, and is amplified thereby before being fed via the switch SW4 to the analog filter 58. Thus, in this case, the output signal of the sensor element SE2 is processed by the analog filter 58. 1The control system in FIG. 11 additionally has the switches SW3 and SW4. Thus, the control system of FIG. 10 is simpler than the control system of FIG. 11 regarding the signal input portion.

Third Embodiment

A third embodiment of this invention is similar to the first or second embodiment thereof except for design changes mentioned later.

Figure 12:
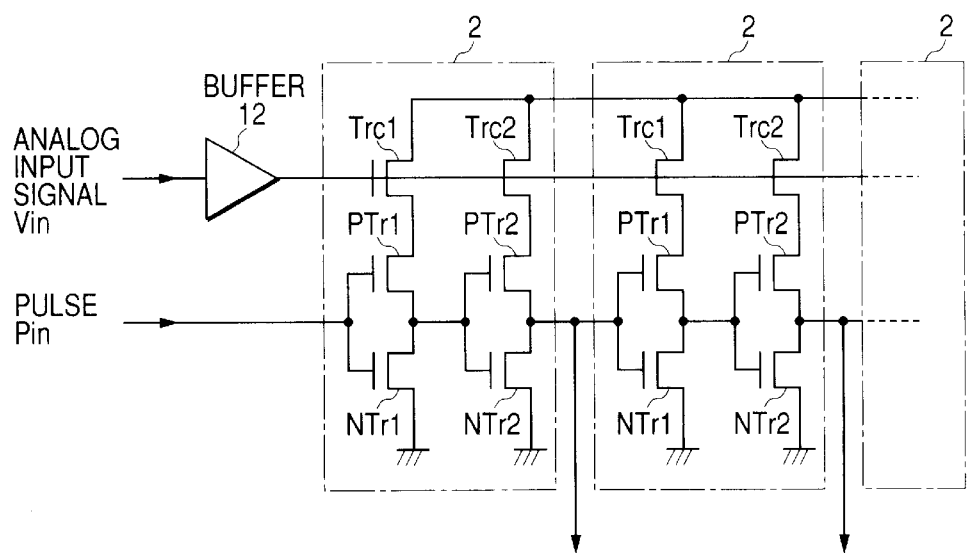
FIG. 12 is a schematic diagram of delay units in a third embodiment of this invention.

FIG. 12 shows the details of delay units 2 in a pulse delay circuit 10 in the third embodiment of this invention. The delay units 12 in FIG. 12 are modified from those in FIG. 9. As shown in FIG. 12, each of the delay units 2 additionally has transistors (FET's) Trc1 and Trc2. The gates of the transistors Trc1 and Trc2 are connected in common to the output terminal of a buffer 12. The source of a transistor PTr1 is connected to a positive power feed line PW via the drain-source path of the transistor Trc1. The source of a transistor PTr2 is connected to the positive power feed line PW via the drain-source path of the transistor Trc2.

An analog input signal Vin is fed via the buffer 12 to the gates of the transistors Trc1 and Trc2 in each of the delay units 2. The transistors Trc1 and Trc2 control drive currents flowing from the positive power feed line PW into first and second CMOS inverters in the related delay unit 2 in response to the voltage of the analog input signal Vin. In each of the delay units 2, a pulse in a signal Pin successively propagates through the first and second CMOS inverters while being sequentially delayed thereby. The pulse delay times provided by the first and second CMOS inverters depend on the drive currents flowing therethrough. Accordingly, the pulse delay times provided by the first and second CMOS inverters depend on the voltage of the analog input signal Vin. The transistors Trc1 and Trc2 correspond to a controlling means.

Fourth Embodiment

Figure 13:
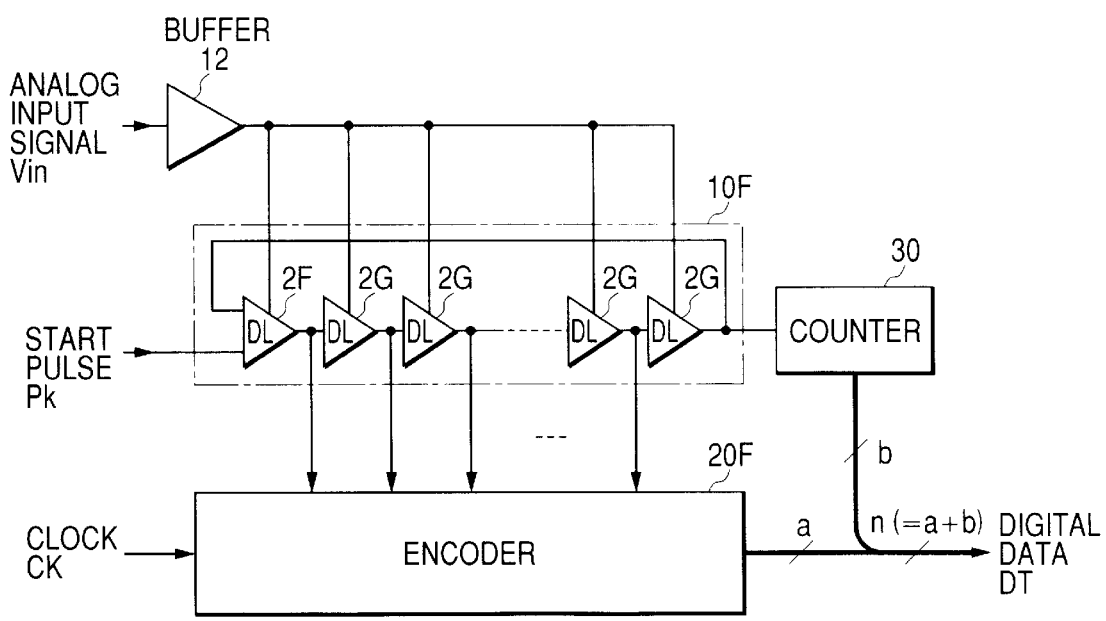
FIG. 13 is a block diagram of a signal-level detecting apparatus according to a fourth embodiment of this invention.

FIG. 13 shows a signal-level detecting apparatus according to a fourth embodiment of this invention. The apparatus of FIG. 13 is similar to the apparatus of FIG. 5 except for design changes mentioned later. The apparatus of FIG. 13 includes a pulse delay circuit 10F instead of the pulse delay circuit 10 (see FIG. 5). The apparatus of FIG. 13 additionally includes a counter 30.

The pulse delay circuit 10F has a ring or loop of delay units 2F and 2G. Thus, the pulse delay circuit 10F has a ring delay line. The first-stage delay unit 2F uses a NAND circuit. Each of the second-stage and later-stage delay units 2G uses an inverter. The total number of the second-stage and later-stage delay units 2G is equal to a predetermined even integer.

A start pulse signal Pk is applied to a first input terminal of the NAND circuit (the first-stage delay unit) 2F. The NAND circuit 2F, that is, the first-stage delay unit 2F, is successively followed by the second-stage and later-stage delay units 2G. The output terminal of the last-stage delay unit 2G is connected to a second input terminal of the NAND circuit (the first-stage delay unit) 2F and also an input terminal of the counter 30.

Each of the delay units 2F and 2G delays a signal inputted thereinto, and outputs the resultant delayed signal. A pulse can circulate through the ring in the pulse delay circuit 10F. Specifically, the start pulse signal Pk causes a pulse to start circulating through the ring in the pulse delay circuit 10F. During circulation through the ring, the pulse is delayed and inverted when passing through each of the delay units 2F and 2G. The device 30 counts every pulse outputted from the last-stage delay unit 2G, and thereby detects the number of times of complete circulation of the pulse through the ring. The counter 30 outputs b-bit parallel-form data, where "b" denotes a predetermined natural number. The b-bit parallel-form data represent the detected number of times of complete circulation of the pulse through the ring. The counter 30 can be reset in response to a clock pulse signal CK.

The delay units 2F and 2G have respective power supply terminals connected in common to the output terminal of a buffer 12. An analog input signal (a voltage input signal) Vin is applied to the input terminal of the buffer 12. The analog input signal Vin travels through the buffer 12 before being applied to the delay units 2F and 2G as a drive voltage (a power supply voltage) therefor. It should be noted that the buffer 12 may be replaced by an amplifier.

Data input terminals of an encoder 20 are connected to the output terminals of the delay units 2F and 2G respectively. The device 20 encodes the output signals from the delay units 2F and 2G into a-bit parallel-form digital data, where "a" denotes a predetermined natural number equal to or greater than 2. The encoder 20 outputs the a-bit parallel-form digital data. Specifically, at every suitable timing determined by the clock pulse signal CK, the encoder 20 samples the output signals of the delay units 2F and 2G and determines the logic states of the resultant signal samples. In addition, the encoder 20 detects which of the output terminals of the delay units 2F and 2G the pulse reaches by referring to the determined logic states of the signal samples. The encoder 20 converts the result of the detection into the a-bit parallel-form digital data.

As previously mentioned, the analog input signal Vin is fed via the buffer 12 to the delay units 2F and 2G as a drive voltage (a power supply voltage) therefor. The pulse delay time provided by each of the delay units 2F and 2G depends on the drive voltage fed thereto. Thus, the pulse delay time provided by each of the delay units 2F and 2G depends on the voltage of the analog input signal Vin.

The a-bit parallel-form digital data outputted from the encoder 20 and the b-bit parallel-form digital data outputted from the counter 30 are combined into n-bit parallel-form digital data DT, where "n" denotes a predetermined natural number equal to or greater than 2. The n-bit parallel-form digital data DT represent the voltage (the voltage level) of the analog input signal Vin. Higher bits of the n-bit parallel-form digital data DT are formed by the b-bit parallel-form digital data outputted from the counter 30, while lower bits thereof are formed by the a-bit parallel-form digital data outputted from the encoder 20.

The ring delay line in the pulse delay circuit 10F is shown, for example, U.S. Pat. No. 5,396,247 or U.S. Pat. No. 5,525,899, the disclosure of which is hereby incorporated by reference.

What is claimed is:

1. A method of detecting a signal level which has a filtering function, the method comprising the steps of:
   inputting an analog input signal into a pulse delay circuit including a series combination of delay units, the analog input signal controlling signal delay times provided by the respective delay units;
   inputting a pulse signal into the pulse delay circuit, the pulse signal being transmitted in the pulse delay circuit while being sequentially delayed by the delay units;
   detecting a number of ones among the delay units through which the pulse signal has passed during a setting time from a moment at which the pulse signal is inputted into the pulse delay circuit; and
   generating information representative of a level of the analog input signal in response to the detected number.

2. A method as recited in claim 1, wherein the analog input signal is inputted as a drive voltage for the delay units to control the signal delay times provided by the respective delay units.

3. A method as recited in claim 1, wherein the signal delay times provided by the delay units depend on drive currents fed thereto respectively, and the analog input signal controls the drive currents fed to the delay units to control the signal delay times provided by the respective delay units.

4. A method as recited in claim 1, further comprising the step of changing the setting time to adjust a low pass filtering characteristic for removing high-frequency noise components.

5. A method as recited in claim 1, wherein the delay units are connected in a ring to form a ring delay line through which the pulse signal circulates, and a position of the pulse signal in the ring delay line is detected and a number of times of complete circulation of the pulse signal through the ring delay line is detected, and the information representative of the level of the analog input signal is generated in response to the detected position and the detected number of times.

6. A method as recited in claim 1, wherein:
   the detecting a number of ones among the delay units through which the pulse signal has passed during a setting time from a moment at which the pulse signal is inputted into the pulse delay circuit further comprises detecting a logical state of each of the series combination of delay units during a predetermined clock period by sampling output signals of each of the series combination of delay units; and the generating information representative of a level of the analog input signal in response to the detected number further comprises encoding the logical state of each of the series combination of delay units into digital data.

7. A method as recited in claim 1, further comprising removing high-frequency components from the analog input signal by canceling out noise-induced shorter delay times and noise-induced longer delay times provided by the delay units during the setting time.

8. A signal-level detecting apparatus having a filtering function, the apparatus comprising:

a pulse delay circuit including a series combination of delay units having signal delay times depending on an analog input signal;

means for inputting a pulse signal into the pulse delay circuit, the pulse signal being transmitted in the pulse delay circuit while being sequentially delayed by the delay units;

means responsive to a clock signal for detecting a position in the pulse delay circuit which the pulse signal reaches at a timing determined by the clock signal; and means for generating information representative of a level of the analog input signal in response to the position detected by the detecting means.

9. An apparatus as recited in claim 8, wherein the delay units receive the analog input signal as a drive voltage so that the signal delay times of the delay units depend on the analog input signal.

10. An apparatus as recited in claim 8, wherein the pulse delay circuit comprises means for controlling drive currents fed to the delay units in response to the analog input signal to control the signal delay times of the delay units in response to the analog input signal.

11. An apparatus as recited in claim 8, wherein the detecting means comprises an encoder for converting output signals of the delay units into a signal representing the position in the pulse delay circuit which the pulse signal reaches.

12. An apparatus as recited in claim 8, wherein the delay units are connected in a ring to form a ring delay line through which the pulse signal circulates, and the detecting means comprises means for detecting a number of times of complete circulation of the pulse signal through the ring delay line, and the generating means comprises means for generating the information representative of the level of the analog input signal in response to the detected position and the detected number of times.

13. An apparatus as recited in claim 8, wherein the means responsive to a clock signal for detecting a position in the pulse delay circuit is further for removing high-frequency components from the analog input signal by canceling out noise-induced shorter delay times and noise-induced longer delay times provided by the signal delay units during the timing determined by the clock signal.

14. An analog-to-digital converter comprising:

a pulse delay circuit that includes a plurality of delay units in series, each of the plurality of delay units having an associated delay time that depends on an analog input signal, the pulse delay circuit further includes an input terminal for receiving a pulse signal that is sequentially delayed by the plurality of delay units;

a detecting device for detecting a position of the pulse signal in the pulse delay circuit when the pulse signal reaches a timing in accordance with a clock signal;

a signal generating device for generating a digital signal corresponding to a voltage of the analog input signal in response to the position detected by the detecting device;

wherein the plurality of delay units convert high-frequency noise components of the analog input signal to noise-caused shorter delay times and noise-caused longer delay times that are averaged to normal delay times determined by a noise-free true voltage of the analog input signal for preventing the high-frequency noise components from distorting the digital signal corresponding to the voltage of the analog input signal.

15. The analog-to-digital converter of claim 14, wherein each of the plurality of delay units comprises at least one transistor utilizing the analog input signal as a power supply voltage, the at least one transistor having a gate coupled to the pulse signal.

* * * * *